(12) United States Patent
Hopkins et al.

(10) Patent No.: US 12,669,440 B2
(45) Date of Patent: Jun. 30, 2026

(54) APPARATUS AND METHOD FOR SENSING RF SIGNALS FROM RF PLASMA PROCESSING EQUIPMENT

(71) Applicant: Applied Materials, Inc., Santa Clara, CA (US)

(72) Inventors: Michael Hopkins, Kilbarrack (IE); Paul Scullin, Lucan (IE); JJ Lennon, Ballymun (IE); Thomas Gilmore, Donabate (IE)

(73) Assignee: Applied Materials, Inc., Santa Clara, CA (US)

( * ) Notice: Subject to any disclaimer, the term of this patent is extended or adjusted under 35 U.S.C. 154(b) by 1033 days.

(21) Appl. No.: 17/554,028

(22) Filed: Dec. 17, 2021

(65) Prior Publication Data

US 2022/0196558 A1 Jun. 23, 2022

(30) Foreign Application Priority Data

Dec. 22, 2020 (EP) ..................................... 20216495

(51) Int. Cl.
*G01N 21/66* (2006.01)
*G01R 29/08* (2006.01)
(52) U.S. Cl.
CPC ............. *G01N 21/66* (2013.01); *G01R 29/08* (2013.01)
(58) Field of Classification Search
None
See application file for complete search history.

(56) References Cited

U.S. PATENT DOCUMENTS

| | | | | |
|---|---|---|---|---|
| 5,989,928 A | * | 11/1999 | Nakata | B24B 37/013 |
| | | | | 156/345.25 |
| 6,441,620 B1 | | 8/2002 | Scanlan et al. | |
| 2007/0227667 A1 | | 10/2007 | Yamazawa | |
| 2008/0197854 A1 | | 8/2008 | Valcore et al. | |
| 2009/0299421 A1 | * | 12/2009 | Sawchuk | A61B 5/7221 |
| | | | | 607/28 |

FOREIGN PATENT DOCUMENTS

| | | |
|---|---|---|
| CN | 102714167 A | 10/2012 |
| CN | 104685365 A | 6/2015 |
| CN | 106024662 A | 10/2016 |
| EP | 2877864 A2 | 6/2015 |

(Continued)

OTHER PUBLICATIONS

Search Opinion and Report, EP Application No. 20216495.0, dated Jun. 9, 2021, pp. 8.

(Continued)

*Primary Examiner* — Andrew Smyth
(74) *Attorney, Agent, or Firm* — Patterson + Sheridan, LLP

(57) ABSTRACT

A sensing device for monitoring electromagnetic radiation emanating from a plasma processing system. The sensing device may, for example, comprise at least two of a first probe for detecting a time varying RF electric field, a second probe for detecting a time varying RF magnetic field, and an optical probe for detecting the modulated light emission. The sensing device may, for example, further comprise a signal processing unit configured to receive a signal from each probe and to monitor the electromagnetic radiation with respect to only a single frequency of each signal.

18 Claims, 12 Drawing Sheets

(56)        References Cited

FOREIGN PATENT DOCUMENTS

| EP | 2877864 | B1 | * | 1/2017 | ............. | G01R 23/20 |
|----|---------|-----|---|--------|----------|------------|
| EP | 3602602 | A1 | | 2/2020 | | |
| WO | 2004006298 | A2 | | 1/2004 | | |
| WO | 2014016357 | A2 | | 1/2014 | | |
| WO | 2018177965 | A1 | | 10/2018 | | |

OTHER PUBLICATIONS

Action in related application TW 110147760 dated Sep. 3, 2025.
Office Action for Korean Application No. 10-2021-0185047 dated Jul. 25, 2025.
Chinese Office Action for Application No. 202111581363.5 dated Apr. 4, 2026.

* cited by examiner

100

103

106

101

102

105

107

100

201

200

203

202

204

202

201

302    303    301    401

403

402

APPARATUS AND METHOD FOR SENSING RF SIGNALS FROM RF PLASMA PROCESSING EQUIPMENT

CROSS-REFERENCE TO RELATED APPLICATIONS

This application claims priority to European Patent Application No. EP20216495, filed Dec. 22, 2020, the entire contents of which are incorporated herein by reference.

FIELD

The present invention generally relates to the analysis of alternating electromagnetic fields from plasma systems at RF frequencies.

BACKGROUND OF THE INVENTION

Plasma processing of materials is ubiquitous in modern industrial manufacturing industries. A common example is the etching and deposition of layers to form transistors during the manufacture of integrated circuits in the semiconductor industry. Plasma processing is also used in the manufacture of solar panels, flat panel displays, thin film coatings and medical devices—to name but a few.

Plasma is typically formed within a vacuum chamber. Once the air is evacuated, a gas recipe is added to the chamber at a chosen gas pressure. Energy is supplied to the vacuum chamber, usually electrical energy, to excite the gas to the plasma state. The plasma state supplies the ions needed to modify the surface of the workpiece.

Electrical energy in the radio-frequency (RF) band is commonly used to power plasma reactors. The RF range is typically between tens of kilohertz and hundreds of megahertz. Radio waves are coupled from an RF generator to the plasma chamber through the RF power delivery subsystem which includes a matching network to maximise power transfer. Power can be coupled to the plasma in a number of different ways. In one configuration, an RF powered electrode can be used to excite the plasma via the electric field (E-field) formed between said powered electrode and a counter electrode. The counter electrode may be another electrode or the chamber vessel body, typically held at ground potential. When the E-field strength is sufficient, electrical breakdown occurs and the plasma is formed. RF current sustains the discharge and flows between the powered electrode and ground. Electrons, stripped from their parent atoms and molecules, oscillate back and forward in the RF E-field, ionizing the background gas in the process thus sustaining the plasma.

In another configuration the RF power is coupled to the plasma through a RF antenna. The antenna does not need to be in direct contact with the background gas. RF current flowing through the antenna induces a time varying magnetic field (H-field), perpendicular to direction of current flow. The H-field is commonly coupled to the chamber through a dielectric window. Once breakdown occurs, the H-field induces an E-field in the plasma which drives RF current. The free electrons oscillate in the RF fields, ionizing the background gas, thus sustaining the plasma. Many other plasma reactor configurations and plasma generation mechanisms exist.

Regardless of the type of RF coupling mechanism, an interface region between electrode or antenna and the plasma necessarily exists. This region is called a plasma sheath. The sheath has a non-linear RF impedance. Consequently, harmonics of the fundamental driving frequency are excited. The plasma voltages and currents can have rich harmonic spectra as a result. The RF harmonic signature of the plasma process is determined by many variables including the fundamental plasma parameters, the plasma chemistry, the chamber geometry, the chamber surface conditions and the mechanical characteristics of the chamber. The harmonic spectrum thus contains significant information about the plasma process health and performance.

As the plasma electrons oscillate in the RF fields they ionize and/or excite the neutral gas particles. Electron impact excitation events are accompanied by optical emission. Much of the light emitted comes from the visible region of the electromagnetic spectrum. The light emission occurs at specific wavelengths depending on the type of gas used. In RF plasmas the light emission intensity is modulated at the RF driving frequency and its higher harmonics by the electron motion.

In certain plasma reactor configurations there will be one or more driving frequency. This generates a harmonic spectrum for each fundamental driving frequency as well as intermodulation frequencies. A sensing apparatus to accurately measure the characteristics of the frequency spectra generated in RF powered plasma reactors is highly desirable. Accurately measured frequency/harmonic spectrum signatures can be used to monitor process performance in real time.

The plasma processing system is often "leaky" to electromagnetic fields, due to its design. The RF time-varying electric and magnetic fields radiate through any non shielded or improperly grounded regions. Optical emission radiates through any opaque regions such as viewports. This provides three means of sensing RF spectra radiating from the plasma processing system, using; a) a time-varying E-field sensor, b) a time varying magnetic field (B-dot) sensor and c) a time varying light-intensity sensor.

The RF spectrum is typically presented as a signal amplitude versus frequency graph. The signal amplitude may correspond to the time varying E-field or B-field strength. The time varying optical signal amplitude will correspond closely to the B-field strength, since both are driven by the electron motion within the plasma system. These three signals are actually vector quantities with a phase component as well as amplitude. The phase angles between the fundamental and harmonic frequencies of the individual spectra is a valuable dataset to measure because it is extremely sensitive to the changes in the electron motion within the plasma. Also, the phase relationships between corresponding frequency components of the E-field and B-field spectra have been found to be very sensitive to certain physical phenomena in the plasma process. Through the processing and analysis of the sensed RF spectra, the plasma process can be monitored in real time. To avoid the need for detailed calibration of the measured RF spectra, statistical methods can be used to baseline or fingerprint certain process conditions. This is typically done for known "healthy" processes. Subsequent processes, for the same setpoints, can be compared against the baseline to check for statistically significant changes. Gross changes will be easily detected in a single data channel e.g. a sudden drop or rise in the E-field amplitude could signify a RF generator problem. Other changes may be more nuanced and may require multivariate analysis using many data channels from the RF spectra to detect them e.g. minor air leaks or slight wafer misplacement—nonetheless these issues can be detrimental to the workpiece. Furthermore, some changes may only be detected in the advanced data channels such as the phase measurements provided by this invention. For example the phase measurements can be very sensitive to certain process endpoints e.g. when the etching of a layer is completed—even if that layer constitutes less than one percent of the surface area of the workpiece.

E-field and B-dot probe pairs are commonly used in so-called VI sensors for measuring voltage and current flowing in transmission lines. In publication no. WO2014016357A2, a VI sensor apparatus is described. This sensor is designed to be connected in series with the RF power feed line. For that reason it includes a section of transmission line, as is generally the case for this type of sensor. A broadband capacitive pick-up (E-field probe) is used to determine the voltage signal on the RF line connected to the plasma. An inductive loop (B-dot probe) is used to determine the RF current in the RF line connected to the plasma. The voltage and current pick-ups are embedded in the RF transmission line section of the VI sensor structure. The signal representing the current and voltage are passed to an analog-to-digital converter (ADC), and the digitised signals are processed in a field programmable gate array. While the inline VI sensor is a very important tool, it can be difficult to install without major modification to the plasma system configuration.

In publication no. WO2018177965A1 an apparatus is described by McNally et al in which a specially designed magnetic loop antenna is used to sense the plasma current flowing in the vicinity of a plasma chamber viewport from an external location. The antenna is carefully designed and calibrated. The output of the antenna is coupled to a spectrum analyser to view the frequency spectrum detected by the antenna. The inventors describe a frequency analysis technique to detect resonant features on the plasma. The antenna operating in the isolated near field is critical for the correct functioning of this antenna. Shielding is used to prevent the antenna from detecting signals from matching networks and other far field signal sources.

In publication no. WO2004006298A2 Parsons describes an invention that utilises a RF antenna to sense RF radiation from a plasma system remotely. The antenna can detect harmonic signals and is coupled to a processing unit for analysis. The processing unit is coupled to the plasma tool controller, where the sensed RF signals are used to adjust and maintain parameters of the plasma process based on the measured signal levels.

In publication no. US2007022766, Yamazawa et al describe an apparatus consisting of two magnetic loop antennas, positioned inside the plane of the plasma chamber wall. The antennas are placed near the two electrodes of a capacitively coupled plasma reactor. Voltage signals generated by the magnetic flux threading each loop are coupled to a signal processing unit. The current flowing out of the plasma to the chamber wall is thus calculated.

In publication no. U.S. Pat. No. 6,441,620 B1, Scanlan et al describe a method of fault identification in a plasma process using data from an inline VI sensor. For a given baseline plasma process, the changes in magnitude of a plurality of Fourier components from said baseline, due to changes in a plurality of process input parameters, are determined. These magnitude changes are stored as reference data. During any subsequent production run, the plasma process is monitored for faults and if one is found the baseline process is repeated with input parameter values nominally the same as the original baseline values. The changes in the Fourier components from the original baseline values are determined and compared with the reference data. This comparison is used to determine which of the plasma subsystems is most likely to have caused the fault.

It is clear from the above that there are numerous shortcomings with the prior art. There is a need to address these shortcomings.

SUMMARY

There is disclosed herein a sensing device for monitoring electromagnetic radiation emanating from a plasma processing system comprising at least two of (i) a first probe for detecting a time varying RF electric field, (ii) a second probe for detecting a time varying RF magnetic field and (iii) an optical probe for detecting the modulated light emission and the sensing device further comprising a signal processing unit configured to receive a signal from each probe and to monitor the electromagnetic radiation with respect to only a single frequency of each signal.

The signal processing unit may be further configured to determine the amplitude of each signal from each probe to produce amplitude data.

The signal processing unit may be further configured to analyse the amplitude data to determine a changing average amplitude.

The signal processing unit may be further configured to identify an event as corresponding to amplitude outside predetermined limits with respect to the average amplitude.

Optionally, the signal processing unit is further configured to store amplitude data corresponding to the identified event.

Optionally, the signal processing unit is further configured to store amplitude data for a predetermined time period corresponding to the identified event.

The signal processing unit may be further configured to discard amplitude data determined to not correspond to an identified event.

The signal processing unit may be further configured to average the amplitude data of each signal over a predetermined time period.

Optionally, the signal processing unit is further configured to store the averaged amplitude data corresponding to the predetermined time period.

The signal processing unit may include an in-quadrature module and a local oscillator, the in-quadrature module configured to multiply each signal from each probe by a signal from the local oscillator in order to select the single frequency.

The signal processing unit may include a phase lock loop configured to tune the local oscillator so that it tracks each signal from each probe between a lower and upper frequency limit.

The signal processing unit further may include a filter and averaging module configured to convert the output signals from the in-quadrature module to average values and remove modulation from the output signals to produce the a signal vector for each signal.

The signal processing unit may further include a vectoring block, configured to phase rotate the signal vectors in unison to produce a voltage signal vector on the real axis and having zero phase.

Optionally, he signal processing unit further includes a first in first out buffer configured to store the signal vectors after processing by the vectoring block.

Optionally when the plasma process is pulsed the signal processing unit is configured to analyse amplitude data with respect to at least one of the signals and store parameters of a pulse based on the amplitude data.

BRIEF DESCRIPTION OF THE DRAWINGS

The present application will now be described with reference to the accompanying drawings in which:

FIG. 5(*b*) shows the logic for an FPGA of the sensing device when operating in the high speed detection mode;

DETAILED DESCRIPTION OF THE DRAWINGS

Figure 1:
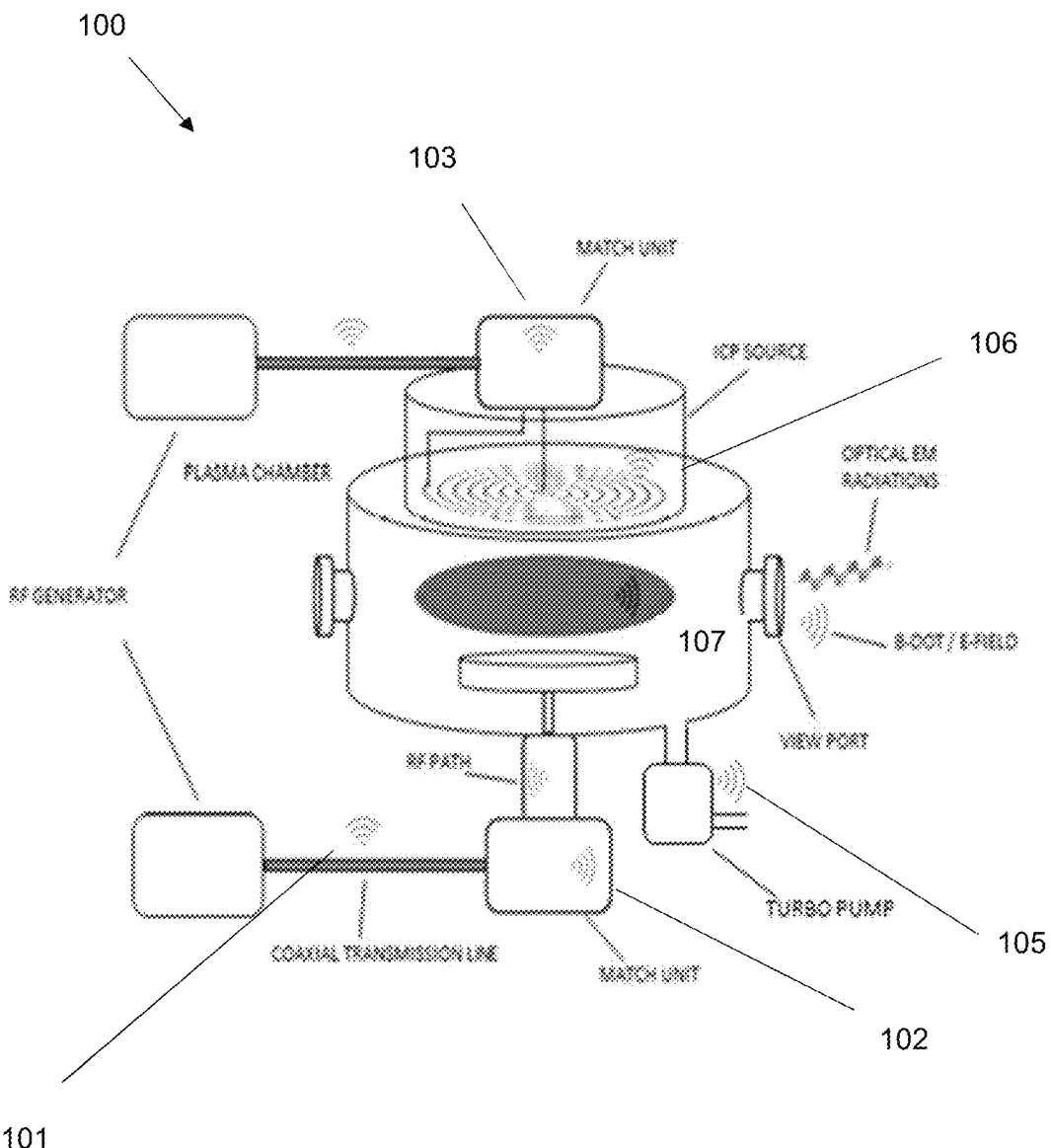
FIG. 1 illustrates a plasma processing system showing the various regions where electrical and optical electromagnetic emission can be detected.

There is provided by present teachings an apparatus/device and method for sensing electromagnetic signals radiating from a plasma processing system, processing the sensed data in the form of RF spectra and analysing said spectra to detect statistically significant plasma process changes to identify fault conditions.

The sensor of the sensing device may comprise two or more of the following three sensing elements; a first probe to sense the time varying electric field, a second probe to sense the time varying magnetic field and an optical probe (e.g., a high frequency photodiode) to detect the RF modulated light emission. The second probe and the optical probe sense the RF current flow within the plasma system. The first probe can be used with one of the other two to detect phase changes between the two fields. When measured simultaneously and synchronously it enables the determination of the phase angle between electric and magnetic field spectral components. That is, the sensing device in accordance with the present teachings samples signals synchronously in such a way as to preserve the phase data between frequencies and harmonics between the signals. This phase measurement is especially sensitive to RF impedance changes of the plasma. The sensing device also includes a signal processing unit. This unit is designed to monitor the phase angle between the fundamental frequency and its harmonics for each individual spectra. These phase measurements are especially sensitive to changes in chemistry within the plasma.

In the present teachings, a remote E-field and B-Dot probe may be used to detect the RF fields emitted from the plasma system. A photodiode or other optical sensor can be added for extra sensitivity. Henceforth, this three element sensor in accordance with the present teachings may be referred to as a VIO sensor. The specific configuration(s) of the VIO sensor in accordance with the present teachings will be described hereinafter.

It should be appreciated that while the terms B-Dot probe and E-field probe are used herein these terms are no intended to limit the sensing device to 'perfect' B-Dot probes that only measure changes along the B axis or 'perfect' E-field probes that only measure changes along the E axis. In practice, the sensing device of the present teachings functions with probes that don't align with the E or B axis as long as the probes are sufficiently independent on the electromagnetic field plane. In the present teachings each probe is susceptible to some amount of the other field i.e., the E-field probe detects the time varying RF magnetic field and the B-Dot probe detects the time varying RF electric field. The probes of the present teachings could be more generally described as two different electromagnetic field probes, each lying in a different vector plane to the other.

One of the three VIO sensor signals is chosen as the reference to which the others are synchronised for phase measurements. The optimum configuration uses the E-field as reference to which the B-field and/or optical RF spectra are synchronised. However, any signal from any of the three probes can be chosen. The reason for synchronisation is to allow determination of the phase relationship between corresponding frequency components of the E-field spectra, B-field spectra and RF spectra.

The phase of the B-field RF frequency components relative to the corresponding E-field RF frequency components is related to the chamber geometry and its mechanical structure. The phase of the optical RF frequency components relative to the corresponding E-field RF frequency components is sensitive to the gas chemistry rather than the geometry. Electrons oscillating in the electric fields excite the gas atoms to a higher energy state. The atom will stay in the excited state for some period of time. When the excited electron decays back to the ground state, a photon of light is emitted. The time between the excitation of the atom and its subsequent return to ground state is seen as a phase shift between the optical RF frequency components and the corresponding electric field frequency components. For this reason it is important to measure both the RF magnetic field and RF optical signal phase shifts for maximum insight into the health and performance of the plasma process.

In modern plasma tools, view port sizes are miniaturised and RF shielding is added to minimise RF leakage through the viewport. RF shielding is often more effective for blocking E-field leakage, but not as effective for B-field leakage. Optical RF emission is unimpeded by RF shielding as long as a line of sight to the internal chamber is available. While the optical detector always needs a viewport, there are many regions of the plasma system where the electrical RF signals can be detected remotely, as illustrated in FIG. 1.

Examples of regions of a plasma processing system where radiated RF signals can be detected include but are not limited to:

(101) the coaxial transmission line between an RF generator and a matching network (unit); whether in-line or through the ground shield (or with an area of shielding removed)

(102) inside the match unit/circuit, at the housing wall for example (103) outside the match unit, through the cooling fan (104) through the RF housing between the match unit and plasmas chamber (a slot may be required)

Figure 2:
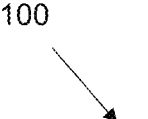
FIG. 2 shows a sensing device in accordance with present teaching wherein the individual sensing elements in a single module.
Figure 2:
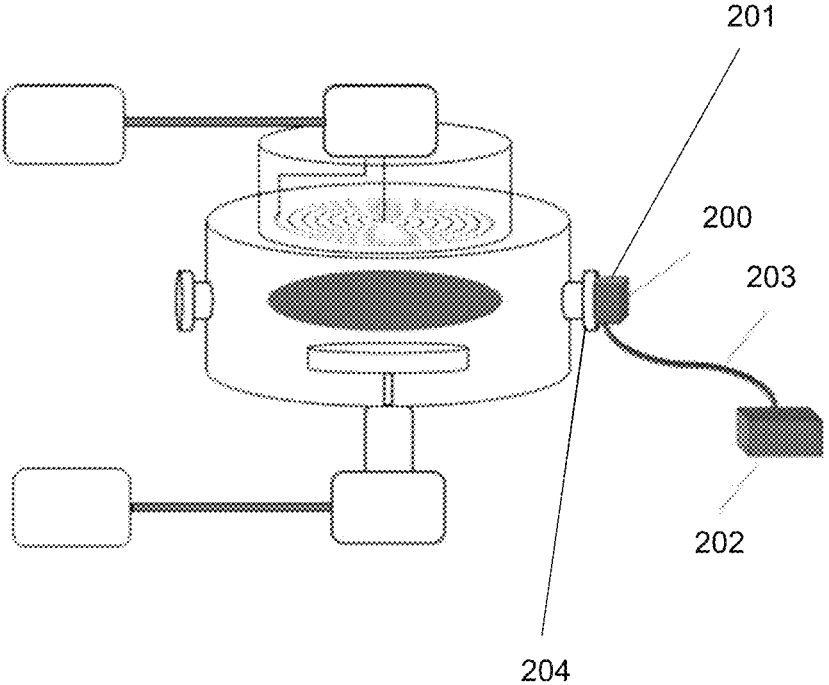

(105) through the turbo pump (106) inside an ICP source region, at the housing wall for example (107) inside the plasma chamber Given that multiple difference locations in a plasma processing system can be chosen for monitoring electromagnetic radiation, the sensor of the sensing device in accordance with the present teachings has two preferred physical configurations. In one configuration the sensing elements are co-located in an "antenna" module. The E-field probe, the B-dot probe and the high frequency photodiode are co-located within the module or housing. This module is ideal for mounting at a larger viewport where two or all three signals can be detected simultaneously. This configuration is illustrated in FIG. 2. This shows the sensor 200 in accordance with the present teachings within the module 201. The module 201 is located at a viewport 204 of the plasma processing system 100.

FIG. 2 also shows the sensor 200 connected to a signal processing unit 202 via a signal coupling cable as will be explained in more detail hereinafter. The combination of the sensor 200 and signal processing unit may be considered to be a sensing device.

Figure 3:
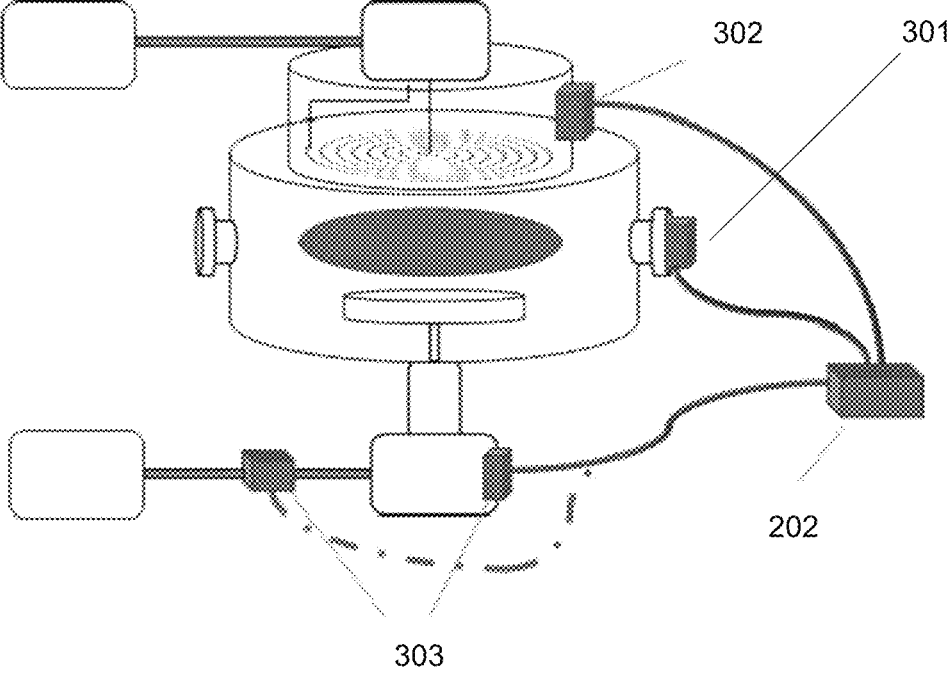
FIG. 3 shows a sensing device in accordance with present teaching wherein the individual sensing elements are distributed about a plasma processing system.

In another configuration, the individual sensing elements of the sensor 200 are distributed to different regions of the plasma processing system 100 where they can be best exposed to the radiated signals that they are sensitive to. This configuration is illustrated in FIG. 3. In this example, the optical detector/sensor 301 is located at the view port (or optical fibre port), the B-Dot sensor 302 is mounted inside the ICP plasma source housing and the E-field probe 303 is either mounted on the internal wall of the match box or inline with the coaxial cable between generator and match box. When installed between the generator and match unit, the E-field probe 303 is exposed to significantly lower harmonic signal levels since they are heavily attenuated by the matching unit. Nonetheless, with a sufficiently sensitive signal processing unit 202, a stable E-field reference can be obtained to allow accurate measurement of the phase changes in the B-Dot and/or optical RF spectra (if the E-field is chosen as the reference).

The B-dot probe 302 comprises of an inductive pickup loop with multiple windings. The time varying magnetic flux threading the loop induces a voltage across the loop output. The loop voltage is coupled to a signal conditioning circuit (also referred to herein as a frequency response levelling circuit herein). The signal conditioning circuit is used to regulate the output voltage of the inductive loop such that magnetic fluxes of equal amplitude, across a wide frequency range, induce equal or similar voltage levels at the output of the signal conditioning circuit.

The E-field probe 303 comprises of a capacitive pickup. The time varying electric field charges the capacitor and induces a voltage across it. The output of the capacitive pickup is coupled to another signal conditioning circuit (frequency response levelling circuit) to achieve the same frequency levelling effect described with respect to the B-dot probe. The signal conditioning circuit is used to regulate the output voltage of the capacitive pickup such that electrical fluxes of equal amplitude, across a wide frequency range, induce equal or similar voltage levels at the output of the signal conditioning circuit.

The optical detector 301 may be a photodiode. The light intensity reaching the photosensitive area of the optical detector induces a voltage at the output. The optical detector 301 is typically sensitive to light in the 200 nm to 1000 nm wavelength range but other ranges can also be used as necessary. The detector is designed to have a flat response to light of the same intensity across a range of wavelengths, within the optical bandwidth specified. In other words the voltage generated at the output of the optical detector is approximately equal for different wavelengths with the same intensity. The optical detector has a high frequency bandwidth. This means that the optical detector output can respond to the time varying light intensity in the 10's kHz to 100's MHz frequency range and is designed to have a flat frequency response in a similar way to the B-dot and E-field sensors. Keeping the response of the sensors regulated across the frequency range of interest prevents issues like saturation due to resonance effects at certain frequencies.

Figure 4:
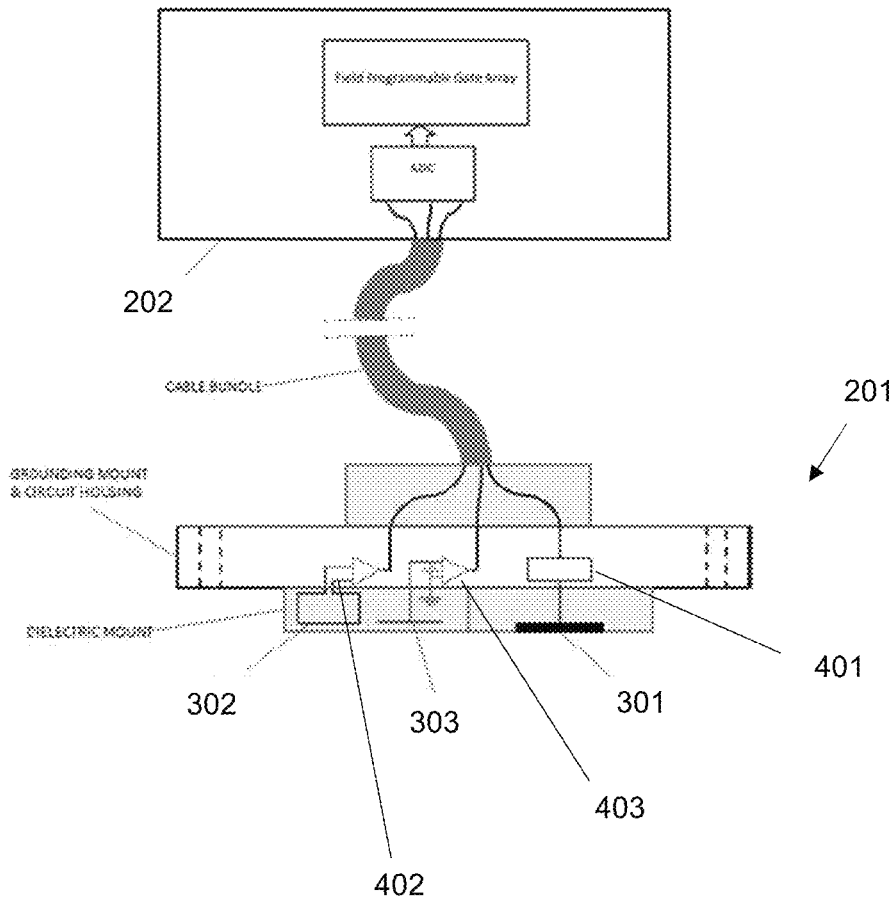
FIG. 4 shows the sensing device of FIG. 2 with co-located sensing elements in more detail.

Turning to FIG. 4, this illustrates the remote, non invasive sensing device in accordance with the present teachings with co-located sensing elements as well as the signal processing unit. That is, FIG. 4 shows the internal configuration of the sensing device i.e., the sensor 201 and signal processing unit 202 of FIG. 2.

The sensing elements (optical sensor 301, E-field sensor 303 and B-dot probe 302) and the frequency response levelling circuits 401, 402 403 make up the analog front end of the VIO sensor in accordance with the present teachings. Each levelling circuit outputs an analog voltage signal proportional to the quantity sensed by the respective sensing element 301, 302, 303. The analog voltage output is an alternating current (AC) signal in the RF band. To extract the frequency spectra in a form that can be analysed and visualised in a useful way, a signal processing unit 202 is incorporated in the VIO sensing device. Individual co-axial cables (which can be bundled in a common sheath) carry the AC signals to the signal processing unit 202. A multi-channel ADC is used to sample the signals from each of the sensing elements. The reference signal (such as the E-field sensor but any one of the sensor can be chosen as a reference), is coupled to channel one of the ADC. The other two channels are synchronised with said channel one. It should be appreciated that the chosen reference signal can be fixed e.g., it is always the signal from the E-field sensor or the signal processing unit can dynamical chose the reference signal using each measurement or sensing procedure. The strongest or highest intensity signal may be chosen or some other criteria may be used by the signal processing unit to choose the reference signal. Any suitable criteria may be chosen by the person skilled in the art.

The high speed ADCs sample the AC waveforms generated by the analog front end. Data sampling is carried out simultaneously or synchronously on all channels. The sampling is done synchronously in such a way as to preserve the phase data between frequencies and harmonics between the two signals. The skilled person can choose the appropriate components and specific technique(s) for ensuring the phase data and harmonics are preserved as appropriate. A data block of 512 samples is typically recorded as a first step. The block size is chosen arbitrarily and can be varied to meet different requirements. The data block is transferred to a field programmable gate array (FPGA) where a fast Fourier transform (FFT) is carried out. The FFT transforms the time domain AC waveform into a frequency spectrum. The frequency spectra are sent to a microprocessor (not shown) of the signal processing unit for storage and further processing, including averaging. Multiple FFTs are averaged together to reduce the signal-to-noise ratio. The averaging also preserves channel phase information.

In the present teachings, the AC waveforms are sampled asynchronously from block to block but synchronously from channel to channel i.e. sampling does not commence at the same point in the AC period each time a new waveform is recorded on any one channel, but sampling occurs on all channels at precisely the same time. As a result, the phase, relative to zero degrees, of the fundamental frequency component and its harmonics varies with each new FFT processed. In order to perform averaging, a phase rotation operation is carried out. The fundamental frequency component of the first ADC channel is chosen as the reference. The phase of the complex fundamental frequency component is rotated to a predetermined phase angle $\phi$. The phase shift $\Delta\phi$ used to rotate the complex fundamental frequency component from its measured value to the predetermined value is recorded. The complex fundamental frequency components off all the individual ADC channels are also rotated by $\Delta\phi$. All harmonic frequency components (N) are rotated by $N\times\Delta\phi$, where N denotes the harmonic number such that N=1 is the first harmonic or the fundamental frequency. This serves the dual purpose of aligning each FFT in phase space to enable averaging across consecutive samples, while also preserving the phase relationship between harmonics within the individual spectra and the phase relationship between corresponding frequency components of spectra from different ADC channels.

After the preconfigured number of averages has been completed, the signal processing unit 202 outputs the dataset to a user for viewing and further analysis. That is, the dataset may be output, in the form of a results table, by the sensing device to external computer resources such as a PC. However, further analysis may also be done (on-board) by the sensing device.

The dataset or results table contains the frequency of each signal fundamental, the magnitude of each signal, the phase of each signal relative to the chosen reference signal, the magnitude of each signal harmonic, each signal harmonics phase relative to its corresponding harmonic on the reference signal, and the phase of the reference signals harmonics relative to the reference signals fundamental for each signal.

The below exemplary results tables correspond to two signals respectfully—signal frequency 1 and signal frequency 2. These tables illustrate that for more than one signal the results table for the first signal is essentially duplicated for any further signals (signal frequencies).

TABLE 1

| | | Signal Frequency 1 | | | | | |
|---|---|---|---|---|---|---|---|
| | | EM1 Sensor | | EM2 Sensor | | Optical 1 Sensor | |
| Harmonic 1 | Fundamental | Magnitude | 0 | Magnitude | Phase wrt EM1 H1 | Magnitude | Phase wrt EM1 H1 |
| Harmonic 2 | Frequency | Magnitude | Phase wrt H1 | Magnitude | Phase wrt EM1 H2 | Magnitude | Phase wrt EM1 H2 |
| Harmonic 3 | | Magnitude | Phase wrt H1 | Magnitude | Phase wrt EM1 H3 | Magnitude | Phase wrt EM1 H3 |
| Harmonic 4 | | Magnitude | Phase wrt H1 | Magnitude | Phase wrt EM1 H4 | Magnitude | Phase wrt EM1 H4 |
| Harmonic 5 | | Magnitude | Phase wrt H1 | Magnitude | Phase wrt EM1 H5 | Magnitude | Phase wrt EM1 H5 |
| Harmonic 6 | | Magnitude | Phase wrt H1 | Magnitude | Phase wrt EM1 H6 | Magnitude | Phase wrt EM1 H6 |
| Harmonic 7 | | Magnitude | Phase wrt H1 | Magnitude | Phase wrt EM1 H7 | Magnitude | Phase wrt EM1 H7 |
| Harmonic 8 | | Magnitude | Phase wrt H1 | Magnitude | Phase wrt EM1 H8 | Magnitude | Phase wrt EM1 H8 |
| Harmonic 9 | | Magnitude | Phase wrt H1 | Magnitude | Phase wrt EM1 H9 | Magnitude | Phase wrt EM1 H9 |
| Harmonic 10 | | Magnitude | Phase wrt H1 | Magnitude | Phase wrt EM1 H10 | Magnitude | Phase wrt EM1 H10 |
| Harmonic 11 | | Magnitude | Phase wrt H1 | Magnitude | Phase wrt EM1 H11 | Magnitude | Phase wrt EM1 H11 |
| Harmonic 12 | | Magnitude | Phase wrt H1 | Magnitude | Phase wrt EM1 H12 | Magnitude | Phase wrt EM1 H12 |
| Harmonic 13 | | Magnitude | Phase wrt H1 | Magnitude | Phase wrt EM1 H13 | Magnitude | Phase wrt EM1 H13 |
| Hermonic 14 | | Magnitude | Phase wrt H1 | Magnitude | Phase wrt EM1 H14 | Magnitude | Phase wrt EM1 H14 |
| Harmonic 15 | | Magnitude | Phase wrt H1 | Magnitude | Phase wrt EM1 H15 | Magnitude | Phase wrt EM1 H15 |

TABLE 2

| | Signal Frequency 2 | | | | | |
|---|---|---|---|---|---|---|
| | EM1 Sensor | | EM2 Sensor | | Optical 1 Sensor | |
| Fundamental | Magnitude | 0 | Magnitude | Phase wrt EM1 H1 | Magnitude | Phase wrt EM1 H1 |
| Frequency | Magnitude | Phase wrt H1 | Magnitude | Phase wrt EM1 H2 | Magnitude | Phase wrt EM1 H2 |
| | Magnitude | Phase wrt H1 | Magnitude | Phase wrt EM1 H3 | Magnitude | Phase wrt EM1 H3 |
| | Magnitude | Phase wrt H1 | Magnitude | Phase wrt EM1 H4 | Magnitude | Phase wrt EM1 H4 |
| | Magnitude | Phase wrt H1 | Magnitude | Phase wrt EM1 H5 | Magnitude | Phase wrt EM1 H5 |
| | Magnitude | Phase wrt H1 | Magnitude | Phase wrt EM1 H6 | Magnitude | Phase wrt EM1 H6 |
| | Magnitude | Phase wrt H1 | Magnitude | Phase wrt EM1 H7 | Magnitude | Phase wrt EM1 H7 |
| | Magnitude | Phase wrt H1 | Magnitude | Phase wrt EM1 H8 | Magnitude | Phase wrt EM1 H8 |
| | Magnitude | Phase wrt H1 | Magnitude | Phase wrt EM1 H9 | Magnitude | Phase wrt EM1 H9 |
| | Magnitude | Phase wrt H1 | Magnitude | Phase wrt EM1 H10 | Magnitude | Phase wrt EM1 H10 |
| | Magnitude | Phase wrt H1 | Magnitude | Phase wrt EM1 H11 | Magnitude | Phase wrt EM1 H11 |
| | Magnitude | Phase wrt H1 | Magnitude | Phase wrt EM1 H12 | Magnitude | Phase wrt EM1 H12 |
| | Magnitude | Phase wrt H1 | Magnitude | Phase wrt EM1 H13 | Magnitude | Phase wrt EM1 H13 |
| | Magnitude | Phase wrt H1 | Magnitude | Phase wrt EM1 H14 | Magnitude | Phase wrt EM1 H14 |
| | Magnitude | Phase wrt H1 | Magnitude | Phase wrt EM1 H15 | Magnitude | Phase wrt EM1 H15 |

When outputting the data, amplitude and phase information for each frequency component of each sensor channel is reported. Typically, the phase difference between the relevant frequency components is calculated and output to the user. The signal processing unit is designed to be capable of processing multiple fundamental frequency components simultaneously. This is particularly useful when monitoring plasma processes powered by more than one frequency. The signal processing unit can typically output a full data set at selectable speeds in the range from approximately 1 millisecond to 1 second, depending on the application requirements.

Not all RF plasma processes operate in continuous wave (CW) mode. Some are pulsed at frequencies in range for a few hertz to tens of kilohertz. For this reason, the signal processing unit 202 may have a built in external synchronization port. The unit 202 accepts a (TTL) signal input from the pulsed RF generator of the plasma processing system. A boxcar (averaging) technique enables RF waveform capture at specific times during the pulsed RF period. In this scenario, averaging is carried out over multiple pulses. This technique can be used to build up the average pulse profile with one microsecond resolution if required. Apart from the synchronization, the signal processing is carried out in the same way. The pulsed RF signal may have one or multiple power levels during the repetition cycle, but once a TTL synchronisation signal is available the signal processing unit can carry out the analysis unimpeded.

In recent years, pulsed RF plasma processes have been developed such that the fundamental carrier frequency is dynamic rather than fixed. This enables greater control over power matching throughout the pulse period, where mechanical movement of the match positions at the speed required is not practical. Typically, a dynamic range of +/−10% around the carrier frequency is sufficient. The signal processing unit in accordance with the present teaching is also dynamic carrier frequency enabled, for continuous wave and pulsed RF process monitoring. A smart FFT process tracks carrier frequency movement in the frequency bins adjacent to where the fundamental frequency is expected to appear. Thus, the spectrum of the carrier frequency can be obtained at any point within its+/−10% dynamic tuning range.

Another signal processing method may be used by the sensing device (sensor and signal processing unit) in accordance with the present teachings for high speed event monitoring. The aforementioned frequency spectrum analysis requires sampling of a complex waveform and further FFT processing. The FFT is a relatively slow process. Hence, a root-mean-square (RMS) detection technique, with a narrow pass-band filter to isolate the fundamental frequency may be used. It should be appreciated that the sensing device in accordance with the present teachings is capable of operating in two modes—(i) the above described frequency spectrum mode and (i) a high speed detection mode described hereinafter.

In the high speed detection mode, the root mean square (RMS) amplitude of each data channel can be determined in real-time at high speed (typical report rates of one microsecond or less) and high speed amplitude data captured. This high speed method does not allow for harmonic spectrum measurement. However, the real-time, high speed processing enables pulse profile monitoring without the need for synchronisation with a TTL signal. Individual pulse profiles can be captured and analysed compared with the aforementioned averaged pulse profiles obtained in the boxcar technique. Important pulse characteristics such as duty cycle, pulse repetition frequency etc. can be established on a per pulse basis to build up defect or fault correlation metrics. Pulse profile monitoring is just one type of high speed measurement that the high speed detection method can be used for. Another important type of high speed event is the RF arc. Arcs are common in industrial plasma processing chambers and occur for a myriad of reasons. A common type is the micro-arc. Dielectric particles form nano layers on the chamber walls for example. When the outer surface of the layer charges up to a certain level, electrical breakdown of the layer occurs. The arc burns through the layer to reach the grounded wall behind. As it does so, particles are emitted from the surface which can pose a major risk to the wafer being processed. These arcs cause a sudden sharp change in the plasma voltage and current. The severity of the change can be categorised in terms of the length of time it lasts and the relative change in voltage or current level induced. It is very important to measure the onset of micro-arcing as this may often be the prelude to a major or catastrophic arc event which would cause damage to the processing tool. The signal processing unit, operated in the high speed detection mode, is ideally suited to detecting such micro-arcing events.

In addition, the high-speed mode provides full "time coverage" of the signals from the sensors/probes. Known methods use a block technique, which monitors portions of time in the signal akin to looking though a picket fence, it is possible to see what's behind without getting 100% coverage. That is, the prior art relies on discrete sampling while the present teachings provide continuous monitoring. It is important for event detection to have 100% time coverage of the signal so that events are not missed. That is, the continuous monitoring of an entire plasma process can be provided and amplitude data is obtained for the entire process. The signal processing unit is configured to continuously determine the amplitude of each signal from each probe to (continuously) produce amplitude data.

Figure 5A:
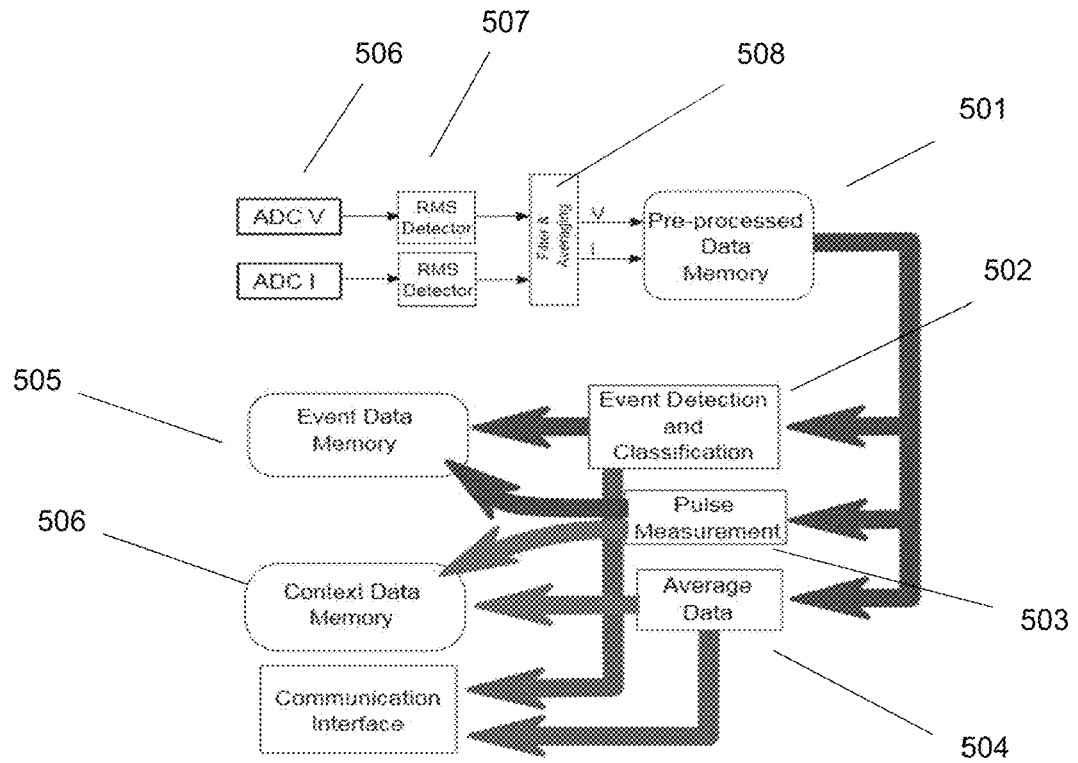
FIG. 5(*a*) illustrates the flow of data from the ADC to the memory of the sensing device when operating in a high speed detection mode.
Figure 5B:
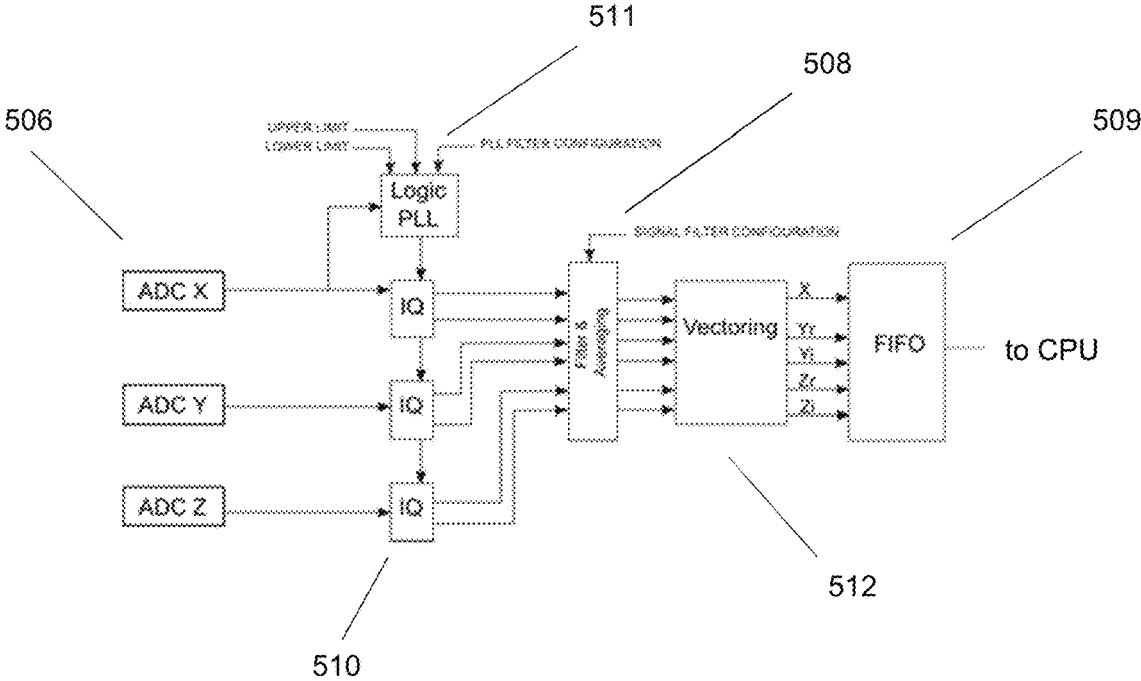

FIG. 5(*a*) shows the flow of data from ADC to memory with respect to the high speed mode of operation. This all happens inside the VIO sensing device and is performed by a combination of the FPGA and on-board CPU within the signal processing unit 202. In this exemplary embodiment, all high speed amplitude data is transferred in blocks from FPGA to CPU with resolution of one microsecond. That is, high speed amplitude data is transferred from the pre-processed data memory 501 to the event detection and classification module 502, the pulse measurement module 503 and data averaging module 504 of the CPU. The CPU checks for events and stores up to 5 ms of data locally in RAM (Event Data Memory 505) for each detected event. It will be appreciated that any length of time can be chosen as appropriate and 5 ms is merely an example. The event detection technique uses a moving (changing) average to compare the most recent value against. In the exemplary embodiment, the moving average is simply the average of the last 1000 values, i.e. the last 1 ms. An event is classified as corresponding to an amplitude outside user defined limits with respect to the moving average.

The CPU also averages the measured RMS signal level and stores the averaged data every 100 ms (in Context Data Memory 506). Again the choice of 100 ms is arbitrary and any time period can be chosen. This "context" average is different to the aforementioned moving average and in the exemplary embodiment is an average of points in each 100 ms block.

The CPU checks for arc and RF pulse events, storing arc and/or pulse snapshots for each event in the event data memory 505. That is, the CPU processes all data in the first in, first out buffer (FIFO) 509 and stores only data which corresponds to an event in the event data memory. The average "context" data is stored (i.e. 1 data point every 100 ms) so that the signal processing unit records the average rms values.

With respect to the pulse (profile) measurement module 503, it provides high resolution captures of out of specification pulses for storage in the event data memory 505. The pulse measurement module 503 provides pulse statistics every 100 ms. (i.e., period, duty cycle, average "on" values, max and min "on" values) to the context data memory.

Software running on a connected PC may retrieve the data from the sensor's event data memory and context data memory and store it to files on a connected PC.

It should be appreciated that the signal processing unit does not have to capture and store both event data and context data. Only one these processes could be performed according to user requirements. However, capturing the context data with the event data is advantageous. Having the "context" data provides a way to determine what else was going on at the time an event occurs, i.e. did an event happen just after the power was applied. Was voltage and current different than normal before and after the event (relative to a previously run plasma process).

How the high speed amplitude data, stored in memory 501, is captured and processed using the ADCs 506, RMS detectors 507 and the filter and averaging block 508 is outlined in more detail with respect to FIG. 5(*b*).

The sensing device may also be provided with a communication interface. This can be used to stream the data to external computing resources (e.g., a PC). The interface also allows the computing resources to request the data rather than having it streamed.

The block diagram shown in FIG. 5(*b*) illustrates the FPGA logic used for the aforementioned high speed (RMS). The FPGA logic shown in FIG. 5(*b*) used for RMS detection is very different to the logic used for harmonic spectrum detection (spectrum mode). It will be appreciated that the configuration described herein is merely exemplary and the person skilled in the art may use alternative logic configuration in order to achieve the same high speed detection mode of the sensing device in accordance with the present teachings.

With respect to FIG. 5(*b*), the signal process unit of the sensing device in the high speed mode tracks only one fundamental frequency, and determines the amplitude and phase of the sensor signals at an update rate of one microsecond or faster. This data is stored in a first in, first out (FIFO) buffer 509 ready for retrieval by the CPU. The CPU interface allows the FPGA registers to be memory mapped in the CPUs memory space. The CPU sets up direct memory access (DMA) transfers from the FPGA's FIFO directly to memory.

The RMS FPGA logic has two clock domains, one relates to the ADC clock sampling rate, while the other clock domain relates to the CPU interface. The high level diagram shown in FIG. 5(*b*) illustrates the signal path from the ADC 506 to FIFO memory 509. An in-quadrature (IQ) block 510 multiplies the V, I or O signal (signals from the individual sensing elements) by a local oscillator signal, which effectively selects the frequency to monitor.

A phase lock loop (PLL) control logic 511 is used to tune the local oscillator so that it tracks incoming signals, between a lower and upper frequency limit. The filter and averaging block 508 converts the instantaneous IQ signals to average values. The IQ output will contain the "DC" signal required, plus a modulation signal related to the sampling frequency and the signal frequency. The filters and averaging logic 508 remove the modulation from the IQ output signals to produce the VIO signal vectors. The VIO signal vectors are then passed to a vectoring block 512 every microsecond, where the VIO signal vectors are phase rotated in unison such that the V signal is real i.e., the vector will lie on the real axis and have zero phase. Then V as well as $I_r$ and $I_i$ and/or $O_r$ and $O_i$ (where subscripts r and i denote the real and imaginary component respectively) are stored in the FIFO 509 ready for the CPU of the signal processing unit to read.

The person skilled in the art will appreciate that the high speed (RMS) detection technique described herein is not limited to the VIO sensing device of the present teachings but can also be used with known prior art sensors such as the aforementioned VI sensor device or any sensor which can supply the appropriate signals. All of the signal (V, I, and O) are not required for this high speed detection technique.

While the VIO remote sensing device in accordance with the present teachings can be calibrated to give absolute measurements of the E-field, B-dot field and modulated light intensities, it is not essential for the type of application described herein. In the following description, a method for baselining a known healthy process is presented, which relies on relative signal intensities only. An acceptable process window is established using a sequence of process runs from known healthy processes. The healthy process window follows a normal distribution for the measured variables. The baselining process involves the measurement of a sample of the distribution for all variables. To establish if a new process run is within the acceptable process window, a statistical method is used. To facilitate the statistical analysis, a database is employed where each measurement is time stamped and stored for later retrieval. This statistical analysis can be done on-board or on an external computer.

One example of the baselining sequence requires the calculation of the mean ($\mu$) and standard deviation (s), for each variable, for the chosen sample size (n). These parameters are stored in memory. The distance from the mean, measured in standard deviations, can be determined for each new measurement. Other methods can also be used.

Individual variables may not be sensitive to certain types of process variance. Each frequency spectrum can include 15 harmonic amplitudes along with 15 associated phases for each fundamental frequency. With 3 ADC data channels and with the inter-spectra phase parameters, hundreds of variables are obtained in each measurement. Therefore, a multi-variable model is implemented for optimum sensitivity. The approach, using distance from the mean analysis, is just one method of many that can be used to establish deviations within a multivariate data set, when compared against a baseline sample. Principal component analysis techniques and neural networks may also be used. Derivatives of the measured datasets can also be used to further improve sensitivity.

Figure 6:
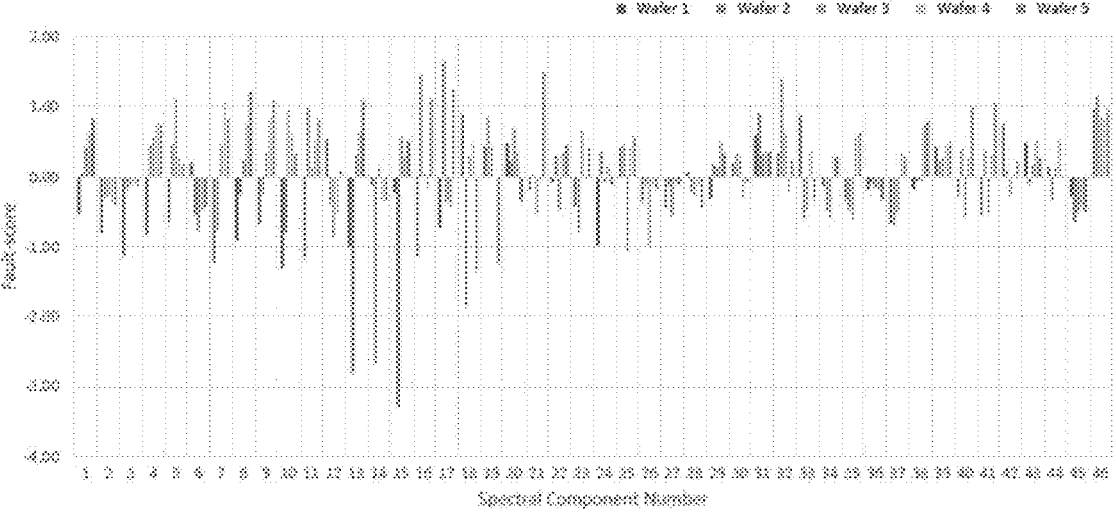
FIG. 6 shows an illustration of a fault score spectral fingerprint that can be produced using the sensing device in accordance with the present teachings.

With the large number of variables that the VIO sensing device is capable of producing, it can sometimes be useful to include only the most sensitive variables in the calculation for optimum sensitivity. Alternatively, all measured variables can be included. A spectral fingerprint is shown in FIG. 6. In this example, a plasma processing chamber was baselined before a set of 5 wafers were run through the processing chamber sequentially. The X-axis shows the spectral component number such that 1-15 are the E-field amplitudes of the fundamental frequency and 14 subsequent harmonics, 16-30 are the B-dot amplitudes for the same frequency components and 31-45 are the phase angles between the channels for each frequency component. Element 46 in this spectrum is the result of the multivariate distance from the mean calculation for each wafer. The calculated values are approximately one standard deviation for all 5 wafers, indicating that the process was in a healthy state throughout. To prevent false-alarms a threshold can be implemented e.g. only a distance from the mean above 6 sigma would be considered a fault (fault score).

The spectrum shown in FIG. 6 has 45 spectral components (and the result of the fault score calculation). Including the optical RF spectrum would bring the number of spectral components to 75. Furthermore, adding the harmonic phase measurements, relative to their fundamental frequency, adds another 14 spectral components for each live data channel. This provides a dataset that is highly sensitive to the majority of faults that can be experienced during plasma processing. The fault score method provides a relatively simple fault detection technique where a large data set is condensed into a single fault score with a statistical significance. However, it is possible that different faults can return the same score. In the event that a classification of the fault is required, a more sophisticated approach is required. For fault classification, spectral pattern recognition techniques can be used such that an intelligent algorithm can be trained to recognise specific fault signatures or fingerprints.

The sensing device and methodology described heretofore can be used to detect various process faults and events including:

a) Chamber wall condition
b) Process end-points
c) Malfunctioning pressure control valves, gas flow problems, leaks
d) Wafer displacement
e) RF Arc events
f) Atypical RF pulse events The techniques described herein can be performed by the sensing device of by an external computer connected to the sensing device and using the data from the sensing device.

Figure 7:
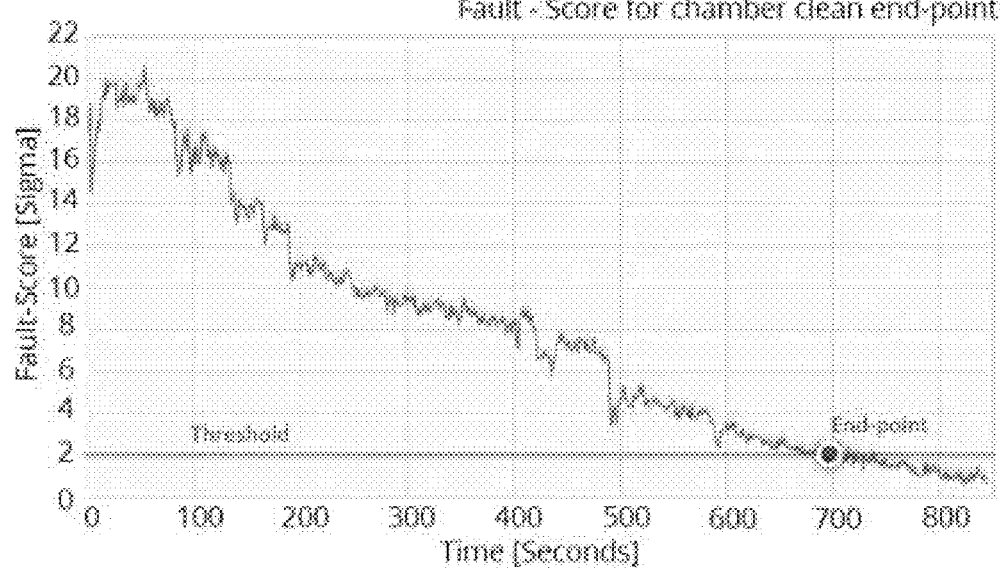
FIG. 7 shows an illustration of fault score monitoring of a chamber cleaning that can be produced using the sensing device in accordance with the present teachings.

It should be noted that e) and f) categories above do not require the same baselining process described earlier. The chamber wall condition is an important consideration for many plasma processes. During the etching or deposition of material in wafer manufacturing, layers are formed on the chamber walls. These layers, especially if non-conducting, can change the plasma impedance significantly. This can change the plasma properties and push the process conditions beyond the acceptable process window. The process can be baselined using the method described earlier, when the chamber walls are known to be clean. When the chamber walls reach a predetermined level of contamination, a chamber clean process is performed. Accurate feedback on when the chamber is adequately clean is highly desirable. FIG. 7 shows the calculated fault score for the chamber during the cleaning process. A score of 2a was determined to be representative of an adequately clean chamber. This technique is used to alert the user when the chamber has reached a clean state. For the example shown in FIG. 7, the chamber reached a clean state after approximately 800 seconds.

Figure 8:
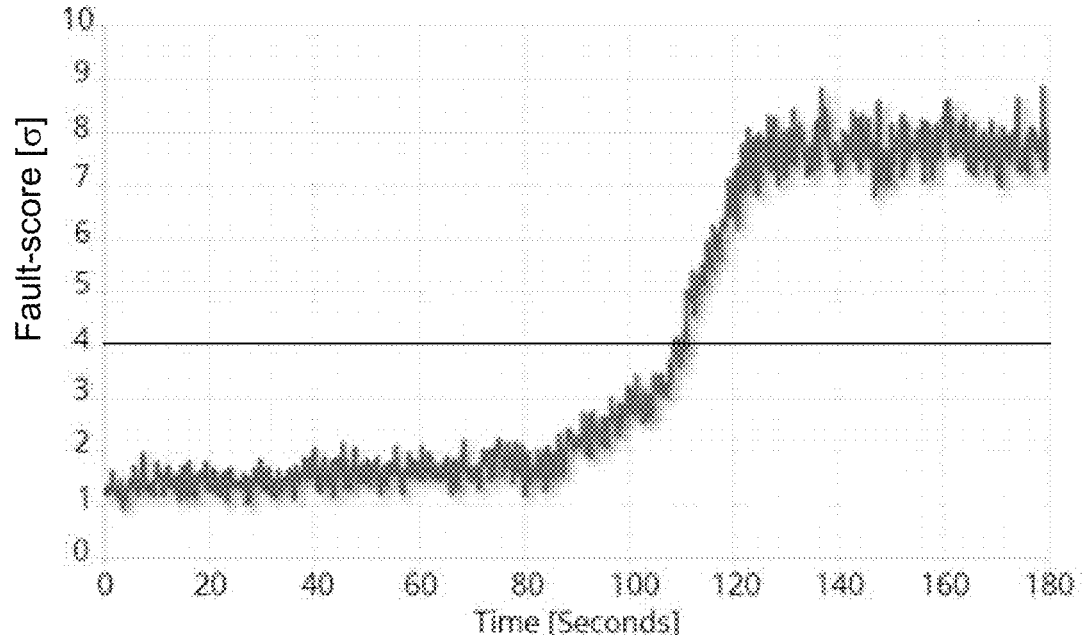
FIG. 8 shows a chart illustrating an example of low open area end-point detection using the sensing device in accordance with the present teachings.

Plasma processing often involves multiple etch and deposition steps to create features and structures on the substrate surface. The etch step usually requires that one layer of a material is removed completely to expose the underlying material. The etch process duration must be chosen carefully to ensure the features are created within dimensional specification tolerances. If the etch process does not run for long enough, the layer will be under-etched i.e. the layer is not fully removed to expose the layer underneath. If the etch process is run for too long the layer will be over-etched i.e. the layer underneath can be damaged when the layer of interest is removed fully but the etching process continues. The term etch end-point is used to define the point in time when the etching process has fully removed the layer of interest. Just after the layer is removed fully, the plasma process will start to etch the material underneath. Optical emission spectroscopy (OES) techniques are often used to monitor the plasma composition and look for the presence of particles from the underlying material. Once these particles are detected it can be assumed that the etching of the layer of interest is complete and the process can be terminated correctly. For very low foreign particle concentrations, OES does not always work. It has been shown that fault score techniques using the VIO sensing device in accordance with the present teachings can be more sensitive to low open area etch end-points compared to OES techniques. FIG. 8 shows an etch end-point example. The process was baselined using data from the beginning of the process. It was established that a 4a score was the optimum time to terminate the process. The RF harmonic spectrum, especially the harmonic phase components (relative to the fundamental), is highly sensitive to small changes in the plasma chemistry seen at the etch end-point. The change in plasma composition due to the new material entering the process can be detected to very low levels using the RF spectra and the T-score method already described. The optical RF spectrum detector of the current invention should not be confused with the standard OES technique mentioned. In the present invention, a high frequency-bandwidth photodiode is used to capture the RF spectrum by measuring the modulation of the light intensity. A standard OES system monitors the time-averaged light intensity emitted from the plasma process and breaks it up into a spectrum of optical wavelengths. Specific wavelengths are used to identify different atomic or molecular species. Therefore, OES is useful for determining the chemical composition of a plasma process. However, at low species concentrations the resolution limit becomes a problem.

Figure 9:
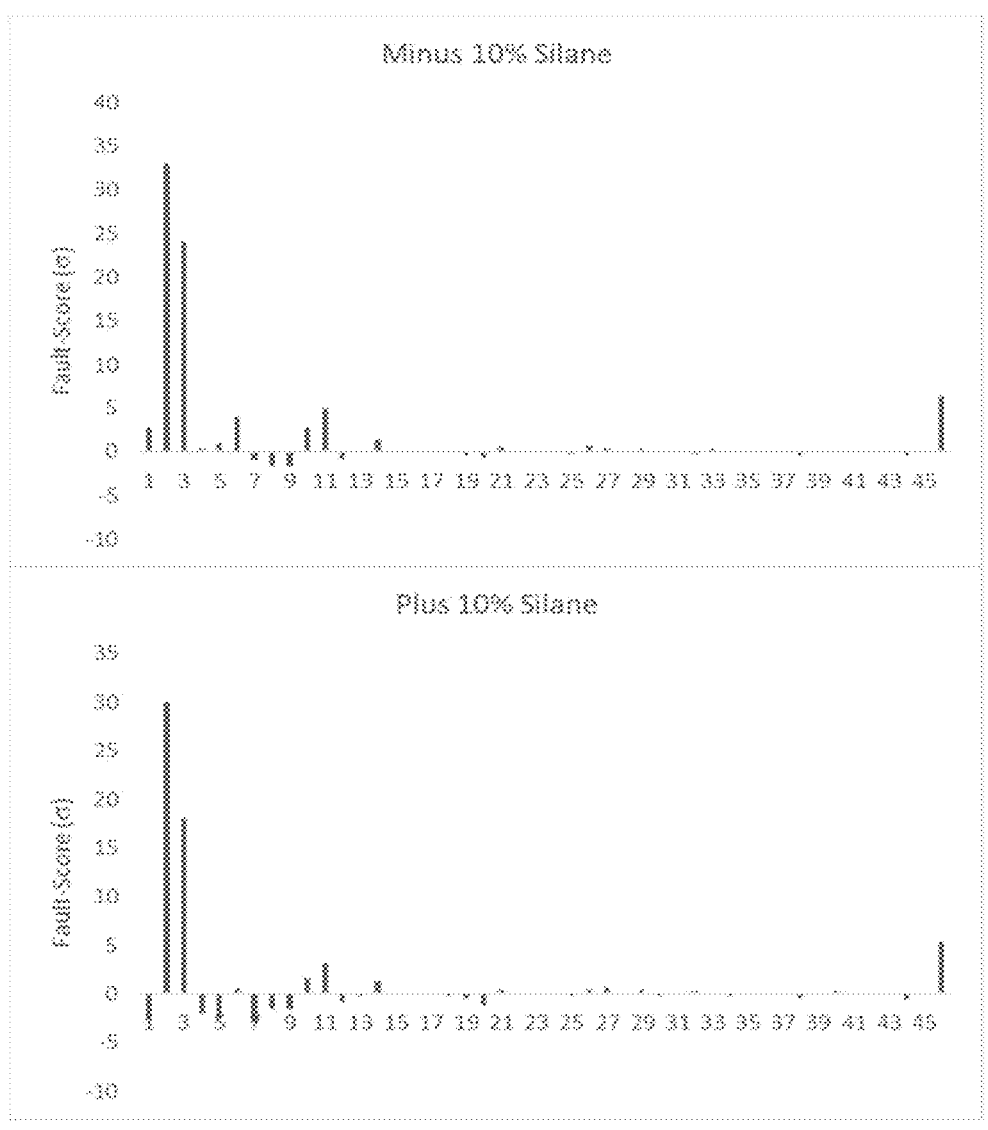
FIG. 9 shows a number of charts illustrating how the sensing device in accordance with the present teachings can detect pressure, gas flow and gas concentrations in a plasma processing system.

Many plasma processing chambers are operated under vacuum. The chamber pressure is tightly regulated. Gas flow and gas concentrations are also tightly controlled. A fault with the pressure and/or gas control systems can have catastrophic consequences for the substrate being processed. To test the sensitivity of the sensing device in accordance with the present teachings to detection of gas flow issues, a control experiment was carried out in a plasma processing chamber running a silane plasma for silicon deposition applications. A baseline spectrum was recorded. The silane concentration was increased by 10% and decreased by 10% relative to the baseline condition while keeping all other parameters constant. A RF fingerprint was recorded for both conditions. The fingerprint fault score space for a 45 channel RF spectrum is shown in FIG. 9. Channel 46 shows the multivariate fault score result. There are clear differences in the spectral fingerprint and the fault score is greater than 5a in both cases, making the change in silane concentration easily detectable. Much lower concentration variations are detectable across a wide range of plasma gas chemistries.

Figure 10:
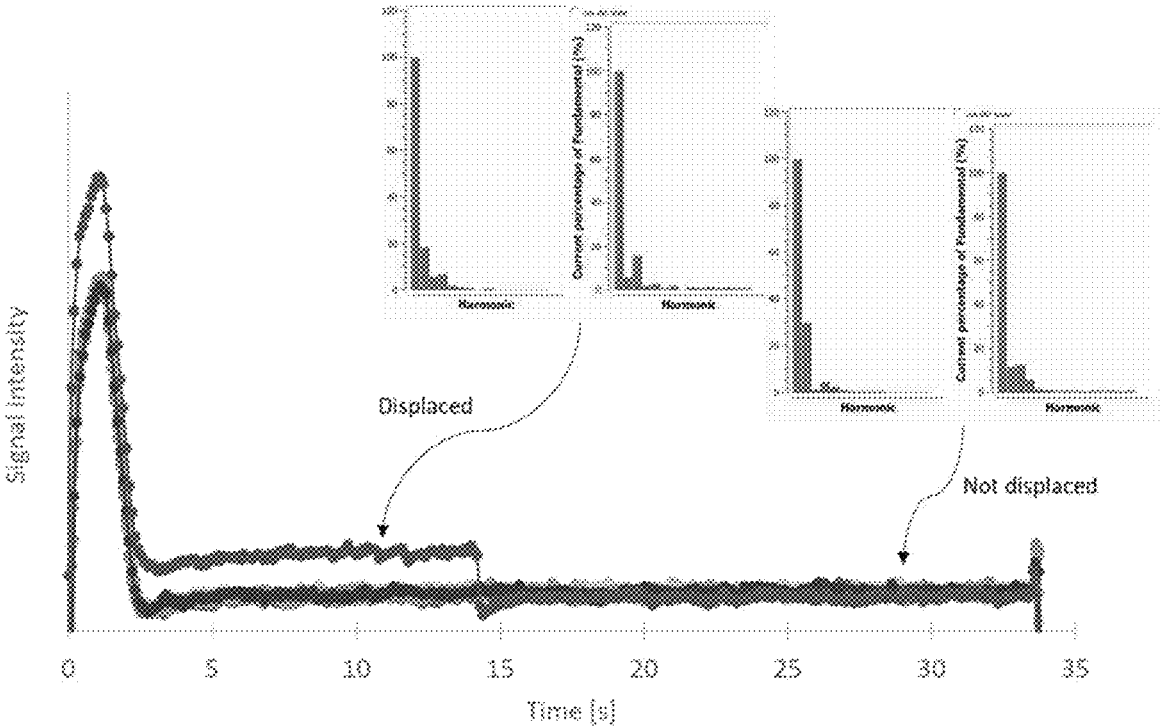
FIG. 10 shows a number of charts illustrating how the sensing device in accordance with the present teachings can detect a displaced wafer within a plasma processing system.

Wafer positioning on the pedestal (or electrostatic chuck) of a plasma processing device is critically important for wafer processing. There are several reasons why a wafer may be displaced on the chuck. The robot arm can malfunction and place it in the incorrect position. More commonly, debris from other parts of the tool can fall on the chuck such that a wafer placed thereon can be elevated off the chuck surface. Regardless of the cause, an undetected wafer displacement can lead to the wafer being incorrectly processed and scrapped down the line. The displacement of a wafer impacts the plasma impedance and the resulting harmonic spectra. FIG. 10 illustrates the impact on the B-dot field measured remotely using the VIO sensor apparatus. The main chart shows a plot of the fundamental B-dot field magnitude versus time during the plasma process. Data for six correctly placed wafers is shown along with data for a displaced wafer. The processing of the displaced wafer was cut short. The inset in FIG. 10 also shows the harmonic spectra of the E-field and B-dot signals for both correctly placed and displaced wafers. The difference is very clear in this example, without the need for statistical analysis. Nonetheless, this example demonstrated the capability of the VIO sensing device in accordance with the present teachings to detect misplaced wafers to prevent wafer scrap events.

Figure 11:
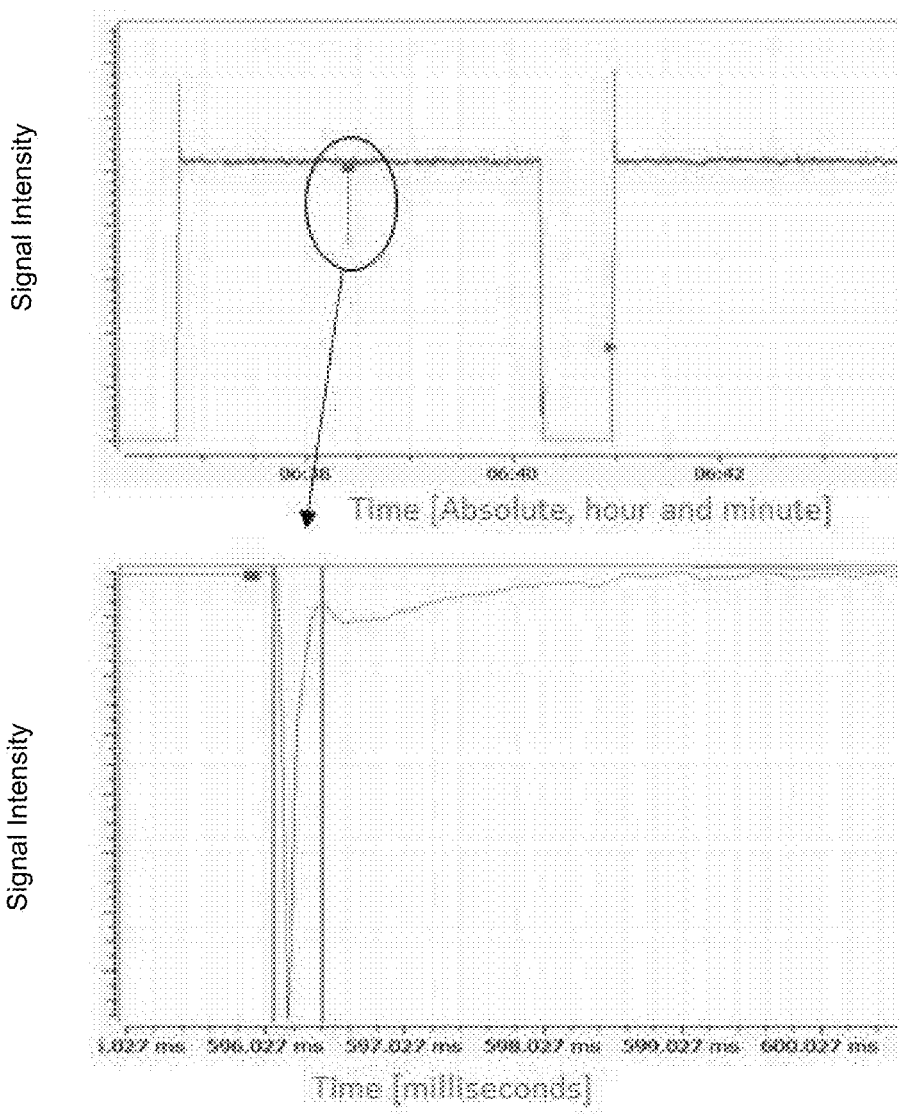
FIG. 11 shows a number of charts illustrating how the sensing device in accordance with the present teachings allows the detection of an arc within a plasma process.

As previously mentioned, when the central signal processing module is configured for high speed (RMS) detection, short-lived (RF) events can be detected remotely. FIG. 11 shows an example of such an event, an arc, being detected in a plasma process. In particular, FIG. 11 shows a top graph illustrates the presence of an arc within a typical plasma process. The bottom graph of FIG. 11 shows a high definition view of the arc with one microsecond resolution It will be appreciated that the VIO sensing device described herein provides a non-invasive method for RF plasma arc detection. Early detection of arcing in a plasma processing chamber is highly desirable as it can avoid product scrappage if remedial action is taken. The arc signature is present in the E-field signal, the B-dot signal and the optical RF signal. Therefore, one or all sensing elements can be used to remotely detect arcs at various locations around the plasma system as illustrated in FIG. 3.

Figure 12:
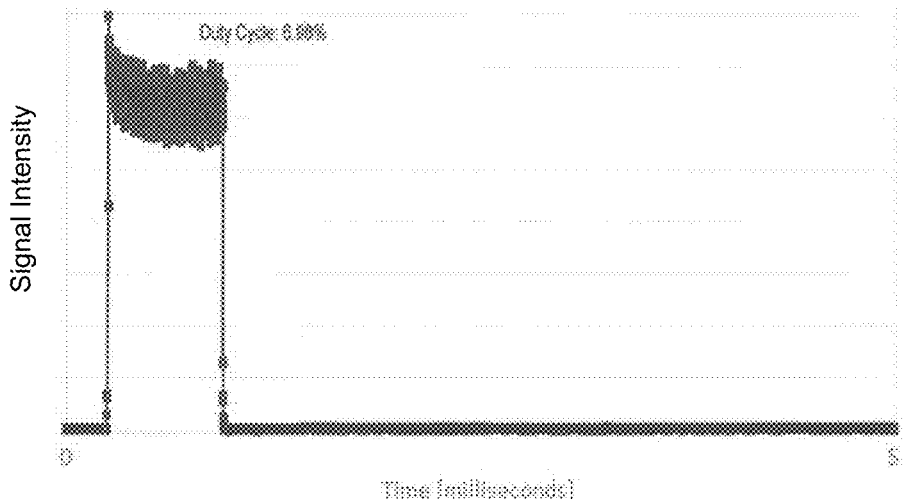
FIG. 12 shows a chart illustrating how the sensing device in accordance with the present teachings allows the detection of a pulse within a plasma process.

Pulsed RF plasma processes are used extensively for advanced semiconductor node manufacturing. Pulsing the plasma provides access to different plasma chemistries not attainable in continuous wave RF mode. These plasmas are typically pulsed in the few hertz to tens of kilohertz frequency range. Achieving highly repeatable plasma conditions, from pulse to pulse, is essential for process yield. To achieve said repeatable plasma conditions the variance of the pulse characteristics must remain within certain thresholds. The number of wafer defects are known to be correlated with pulse variations for example. The high speed (RMS) detection mode of the VIO sensing device is ideally suited to analysing each pulse profile to extract the key pulse characteristics e.g. pulse repetition frequency, duty cycle, pulse-on time etc. The signal processing unit (pulse profile measurement module 503) may sample incoming data signals every microsecond (of course other time frames are possible). This provides a detailed snapshot of each pulse profile within the pulsed frequency range of interest. Each pulse profile is analysed in real-time and the important pulse parameters are stored. The pulse profile with one microsecond samples is discarded if it falls within the user configured tolerance limits. On the other hand, if the pulse is out of tolerance the high definition pulse profile is stored for further analysis. This "exception" based approach limits the amount of data produced i.e. only high definition profiles are stored for the pulses that do not meet the tolerance criteria. FIG. 12 illustrates a pulse profile captured by the B-dot sensor of the VIO sensing device in accordance with the present teachings. This was an atypical pulse in which the duty cycle was diagnosed to be outside of the acceptable tolerance range. Specially, FIG. 12 provides an example of single pulse profile capture with one microsecond resolution over a five millisecond window.

It should be appreciated that the statistical analysis and processing of the detected data or RF spectra described with respect to FIGS. 6 to 12 above can be done locally on the sensing device of the present teachings or remotely at computing resources (e.g., a PC) connected to the sensing device.

In view of the above, it will be appreciated that the present teachings provide a device and method for sensing RF signals radiating from a plasma processing system, processing said signals in the form of RF spectra, analysing said spectra to determine a plurality of amplitude and phase components and carrying out of statistical analysis to identify fault states of the said plasma processing system based on variations of the amplitude and phase components.

The sensor of the sensing device is comprised of an E-field probe, B-dot probe and/or optical RF detector. The E-field probe (or any of the probes) may be used as a reference for the other probes and is used to sense the time varying electric field.

The B-dot probe and optical RF detector are used to sense the time varying electron motion or the plasma current within the reactor. The individual probes may be co-located or distributed at suitable locations around the plasma system.

Unlike prior art designs, the sensing apparatus is not coupled to spectrum analyzer or network analyzer. These analyzers are expensive and cumbersome to use. Also, they do not enable the advanced detection features required. Instead, a signal processing unit is used. The signal processing unit provides new information related to the remotely sensed RF spectra that has not been reported in prior art remote RF plasma sensor designs. Novel measurements are; a) harmonic phase, phase between spectra from different sensors, spectral analysis in pulsed RF and frequency tuning plasma processes, RMS detection of arcs and RMS detection of individual pulsed RF profiles. A statistical method is described based on spectral fingerprinting of known "healthy" plasma process conditions. Variations in the phase and amplitude of the spectral components are analysed and a fault score is attributed to each new process measurement. Thresholds can thus be configured to alert the user to detected process faults. The phase measurements are particularly sensitive to small changes in plasma chemistry and plasma impedance. The ability to measure phase, as described, makes the sensing device of the present teachings a very useful diagnostic tool for detection of subtle process changes that occur during low open area endpointing, for example, where standard technology is now falling short.

There is provides herein three means of sensing RF spectra radiating from the plasma processing system, using; a) a time-varying E-field sensor, b) a time varying magnetic field sensor and c) a time varying light-intensity sensor. The sensing device in accordance with the present teachings provides mon-invasive sensing of the radiated RF spectra through these three mechanisms, or pairs thereof, simultaneously and synchronously, which provides extra data channels not provided by prior art designs.

The invention is not limited to the embodiment(s) described herein but can be amended or modified without departing from the scope of the present invention.

The invention claimed is:

1. A sensing device for monitoring electromagnetic radiation emanating from a plasma processing system comprising at least two of:

(i) a first probe for detecting a time varying RF electric field;

(ii) a second probe for detecting a time varying RF magnetic field; and (iii) an optical probe for detecting the modulated light emission; and the sensing device further comprising:

a signal processing unit configured to receive a signal from each probe, monitor the electromagnetic radiation with respect to only a single frequency of each signal, continuously determine the amplitude of each signal from each probe to produce amplitude data, and analyse the amplitude data to determine a changing average amplitude according to a high speed detection mode, wherein the high speed detection mode enabling pulse profile monitoring without the need for synchronisation with a TTL signal.

2. A sensing device for monitoring electromagnetic radiation emanating from a plasma processing system comprising at least two of:

(i) a first probe for detecting a time varying RF electric field;

(ii) a second probe for detecting a time varying RF magnetic field; and (iii) an optical probe for detecting the modulated light emission; and the sensing device further comprising:

a signal processing unit configured to receive a signal from each probe, monitor the electromagnetic radiation with respect to only a single frequency of each signal, continuously determine the amplitude of each signal from each probe to produce amplitude data, analyse the amplitude data to determine a changing average amplitude according to a high speed detection mode, and identify a high speed event based on the analysis of the amplitude data according to the high speed detection mode, the high speed event including a RF arc event or an RF pulse event.

3. The sensing device of claim 1 wherein the signal processing unit is further configured to identify a high speed event based on the analysis of the amplitude data according to the high speed detection mode.

4. The sensing device of claim 3 wherein the signal processing unit is further configured to store amplitude data corresponding to the identified high speed event.

5. The sensing device of claim 4 wherein the signal processing unit is further configured to store amplitude data for a predetermined time period corresponding to the identified high speed event.

6. The sensing device of claim 5 wherein the signal processing unit is further configured to discard amplitude data determined to not correspond to an identified high speed event.

7. The sensing device of claim 1 wherein the signal processing unit is further configured to average the amplitude data of each signal over a predetermined time period.

8. The sensing device of claim 7 wherein the signal processing unit is further configured to store the averaged amplitude data corresponding to the predetermined time period.

9. The sensing device of claim 1 wherein the signal processing unit includes an in-quadrature module and a local oscillator, the in-quadrature module configured to multiply each signal from each probe by a signal from the local oscillator in order to select the single frequency.

10. The sensing device of claim 9 wherein the signal processing unit includes a phase lock loop configured to tune the local oscillator so that it tracks each signal from each probe between a lower and upper frequency limit.

11. The sensing device of claim 9 wherein the signal processing unit further includes a filter and averaging module configured to convert the output signals from the in-quadrature module to average values and remove modulation from the output signals to produce a signal vector for each signal.

12. The sensing device of claim 11 wherein the signal processing unit further includes a vectoring block, configured to phase rotate the signal vectors in unison to produce a voltage signal vector on the real axis and having zero phase.

13. The sensing device of claim 12 wherein the signal processing unit further includes a first in first out buffer configured to store the signal vectors after processing by the vectoring block.

14. The sensing device of claim 1 wherein when a plasma process is pulsed the signal processing unit is configured to analyse amplitude data with respect to at least one of the signals and store parameters of a pulse based on the amplitude data.

15. The sensing device of claim 3 wherein the signal processing unit is further configured to average the amplitude data of each signal over a predetermined time period.

16. The sensing device of claim 4 wherein the signal processing unit is further configured to average the amplitude data of each signal over a predetermined time period.

17. The sensing device of claim 5 wherein the signal processing unit is further configured to average the amplitude data of each signal over a predetermined time period.

18. The sensing device of claim 7 wherein averaging the amplitude data of each signal over a predetermined time period includes averaging 1000 samples over a 1 ms time period.

* * * * *